United States Patent [19]

Baumann et al.

[11] Patent Number: 5,925,491

[45] Date of Patent: *Jul. 20, 1999

[54] AMIDO SUBSTITUTED ACETAL POLYMER BINDERS AND THEIR USE IN PHOTOSENSITIVE COMPOSITIONS

[75] Inventors: Harald Baumann, Osterode; Udo Dwars, Herzberg; Celin Savariar-Hauck, Badenhausen; Hans-Joachim Timpe, Osterode, all of Germany

[73] Assignee: Kodak Polychrome Graphics LLC, Norwalk, Conn.

[*] Notice: This patent issued on a continued prosecution application filed under 37 CFR 1.53(d), and is subject to the twenty year patent term provisions of 35 U.S.C. 154(a)(2).

[21] Appl. No.: 08/781,313

[22] Filed: Jan. 9, 1997

[30] Foreign Application Priority Data

Oct. 25, 1996 [DE] Germany .................. 196 44 515

[51] Int. Cl.⁶ .................. G03F 7/021; G03F 7/033
[52] U.S. Cl. .................. 430/175; 430/176; 430/281.1; 430/288.1; 430/906; 430/909; 430/910
[58] Field of Search .................. 430/175, 176, 430/281.1, 288.1, 906, 909, 910

[56] References Cited

U.S. PATENT DOCUMENTS

| | | | |
|---|---|---|---|
| 2,179,051 | 11/1939 | Morrison et al. | 260/73 |
| 3,372,105 | 3/1968 | Johnson | 204/243 |
| 3,732,106 | 5/1973 | Steppan et al. | 96/115 |
| 3,847,614 | 11/1974 | Mattor | 96/75 |
| 4,123,276 | 10/1978 | Kwita et al. | 96/91 |
| 4,177,073 | 12/1979 | Hata et al. | 430/188 |
| 4,304,832 | 12/1981 | Ohta et al. | 430/175 |
| 4,355,096 | 10/1982 | Walls | 430/302 |
| 4,387,151 | 6/1983 | Bosse et al. | 430/175 |
| 4,511,640 | 4/1985 | Liu | 430/157 |
| 4,618,562 | 10/1986 | Walls et al. | 430/157 |
| 4,652,604 | 3/1987 | Walls et al. | 522/63 |
| 4,665,124 | 5/1987 | Walls et al. | 525/61 |
| 4,681,245 | 7/1987 | Harvey | 222/643 |
| 4,687,727 | 8/1987 | Toyama et al. | 430/175 |
| 4,731,316 | 3/1988 | Tomiyasu et al. | 430/157 |
| 4,741,985 | 5/1988 | Aoai et al. | 430/175 |
| 4,877,711 | 10/1989 | Aoai et al. | 430/176 |
| 4,895,788 | 1/1990 | Walls et al. | 430/278 |
| 4,940,646 | 7/1990 | Pawlowski | 430/175 |
| 4,950,582 | 8/1990 | Aoai et al. | 430/175 |
| 4,983,491 | 1/1991 | Aoai et al. | 430/175 |
| 5,045,429 | 9/1991 | Mack et al. | 430/175 |
| 5,053,310 | 10/1991 | Platzer | 430/162 |
| 5,086,111 | 2/1992 | Pinschmidt, Jr. et al. | 525/61 |
| 5,143,813 | 9/1992 | Joerg | 430/162 |
| 5,169,897 | 12/1992 | Walls | 525/61 |
| 5,176,985 | 1/1993 | Seitz et al. | 430/284 |
| 5,187,040 | 2/1993 | Mueller-Hess et al. | 430/157 |
| 5,206,113 | 4/1993 | Mueller-Hess et al. | 430/270 |
| 5,219,699 | 6/1993 | Walls et al. | 430/156 |
| 5,238,772 | 8/1993 | Mueller-Hess et al. | 430/175 |
| 5,260,161 | 11/1993 | Matsumura et al. | 430/161 |

FOREIGN PATENT DOCUMENTS

| | | |
|---|---|---|
| 1 172 492 | 8/1984 | Canada . |
| 0 487 343 | 5/1992 | European Pat. Off. . |
| 4311738 | 5/1994 | Germany . |
| 63-123858 | 5/1988 | Japan . |
| 1 396 355 | 6/1975 | United Kingdom . |
| 2 007 677 | 5/1979 | United Kingdom . |

OTHER PUBLICATIONS

H. Baumann, H.J. Timpe, "Chemical Aspects of Offset Printing" in Journal für praktische Chemie Chemiker–Zeitung [Journal for Chemists] 336 (1994) pp. 377–389.

*Primary Examiner*—John S. Chu
*Attorney, Agent, or Firm*—Ratner & Prestia

[57] ABSTRACT

Polymeric binders for photosensitive compositions exhibiting improved ink acceptance, good developability and wetting, high photosensitivity, good image resolution, and larger printing runs for plates employing such photosensitive compositions.

20 Claims, No Drawings

AMIDO SUBSTITUTED ACETAL POLYMER BINDERS AND THEIR USE IN PHOTOSENSITIVE COMPOSITIONS

FIELD OF THE INVENTION

The invention pertains to polymeric binders and photosensitive compositions suitable for production of printing plates and graphic arts applications.

BACKGROUND OF THE INVENTION

High demands are placed today on photosensitive compositions used, in particular, for high-performance printing plates. Essentially two avenues are taken to improve the properties of photosensitive compositions and thus, of the corresponding printing plates. One deals with improving the properties of the photosensitive components of the compositions (negative diazo-resins, photoinitiators, photopolymers, etc.), the other with the discovery of new polymer compounds (binders) which are intended to control the physical and mechanical properties of the photosensitive layers. The latter course is of special significance to printing plates, because the behavior in the development and printing process (such as development capability, ink acceptance, scratch resistance, plate life) is critically influenced by the polymer binders selected. The shelf life and photosensitivity of printing plate materials are also influenced by such polymer compounds.

The polymer binders have various structural elements to accomplish the many requirements, and these may have differing effect on individual properties. Thus, hydrophilic structural elements such as carboxyl groups, hydroxyl groups, etc., generally promote a good developability of the photosensitive compositions in aqueous-alkaline developers and contribute to adequate adhesion to polar substrates. On the other hand, hydrophobic structural elements hinder the developability in said developers, but ensure good acceptance of the ink in the printing process, which is absolutely essential for printing plates.

Given the broad spectrum of requirements on polymer binders, there has been much work for many years on the synthesis and optimization of the use of these substances for photosensitive compositions, see for example, H. Baumann and H. J. Timpe, *Chemical Aspects of Offset Printing*, J. prakt. Chem./Chemiker-Zeitung, Vol. 336, pgs. 377–89 (1994).

U.S. Pat. Nos. 4,511,640 and 4,618,562 and U.S. Pat. No. 4,731,316, describe binder systems which consist of mixtures of various polymers, possessing different hydrophilic/hydrophobic properties. Yet such mixtures have drawbacks in that separations of the mixture often occur when forming layers, on account of incompatibilities among the substances. Furthermore, separations of the hydrophobic polymers in the development step when processing the printing plates, may result in silting in the development machines and redeposition of dispersed elements of the layer on the surface of the photosensitive material.

Moreover, various copolymers of less hydrophilic monomers, such as styrene, acrylate, methacrylate, etc., with hydrophilic comonomers have been described. Examples of such comonomers are semi-esters of maleic acid (Canadian Patent 1 172 492 and U.S. Pat. No. 4,687,727) itaconic acid (U.S. Pat. No. 5,260,161), and acrylic acid or methacrylic acid (European Patent EP-A-487 343, U.S. Pat. Nos. 4,304, 832 and 4,123,276). The disadvantage of such polymers is the very narrow margin of applicability for important properties such as film adhesion, developability, ink acceptance, and plate life. Due to the production process, one can hardly avoid variations in the polymer compositions, resulting in unacceptable fluctuations in the properties of the plates.

U.S. Pat. No. 4,177,073 describes a photosensitive compositions in which the binder is a reaction product of cellulose esters with cyclical, intramolecular acid anhydrides of dicarboxylic acids. However, these binders have too little oleophilia for use in printing plate formulations. Furthermore, their plate life does not meet the demands on a modern printing plate.

Another group of binders, acetals of aliphatic aldehydes, with unsubstituted lower alkyl group and vinyl alcohol/vinyl acetate copolymers, have been described (U.S. Pat. No. 2,179,051 and U.S. Pat. No. 4,665,124). But such binders cause problems during the developing of printing plates, owing to the insufficient proportion of hydrophilic groups in the polymer. As an improvement, partially acetalized vinyl alcohol/vinyl acetate copolymers have been provided with hydrophilic or alkaline-soluble groups by special reactions. U.S. Pat. No. 4,940,646 teach aldehyde containing hydroxyl groups that are used for the acetalization, besides aldehydes with hydrophobic groups (e.g., alkyl or aryl groups). Yet this structural change does not result in a distinct improvement in developability.

In order to improve developability, sulfonyl urethane groups were introduced into polyvinyl acetals in U.S. Pat. Nos. 3,372,105 and 3,732,106 and 4,387,151. However, the low acidity of these groups requires developers with a large amount of solvent. Furthermore, the microelements of the resulting printing plate have very poor adhesion and are easily abraded in the printing process.

UK Patent GB 1 396 355 and U.S. Pat. No. 3,847,614, describe binders which can be produced by acetalization of saponified copolymers of vinyl acetate and a carboxyl group-carrying monomer, such as crotonic acid. However, this type of binder results in systems with poor photosensitivity and low plate life when used for printing forms. Moreover, such compositions are poorly developable in aqueous-alkaline developers, because the acid number of the binder is greatly decreased by chemical reactions of the carboxyl group during the saponification and/or acetalization process.

U.S. Pat. Nos. 5,045,429 and 4,681,245, describe introducing carboxyl groups by reacting acetals, which have been separately produced from aliphatic aldehydes and polyvinyl alcohol, with intramolecular cyclical acid anhydrides of dicarboxylic acids. However, the synthesis is uneconomical, for in addition to the acetalization, there is the reaction with the acid anhydrides, which is only possible in aprotic solvents. Furthermore, the photosensitivity of the compositions prepared from this binder is too low.

U.S. Pat. No. 4,741,985 describes binders produced in a three-stage synthesis, starting with polyvinyl alcohol: [1] acetalization with aliphatic aldehydes, [2] reaction with intramolecular cyclical acid anhydrides of dicarboxylic acids, and [3] partial esterification of the carboxyl groups with substituted alkyl halides. Despite the high expense in synthesis of the binder, the photosensitivity of the film made is inadequate.

The expense of a multi-stage synthesis can be avoided if, as described in U.S. Pat. No. 5,219,699, U.S. Pat. Nos. 4,652,604, 4,895,788, 4,940,646 and 5,169,897, polyvinyl alcohol is reacted with aliphatic aldehydes and carboxyl-containing aliphatic or carboxyl-containing aromatic aldehydes. However, the photosensitive compositions prepared from this have an unfavorable relationship in terms of developability and sensitivity.

Mixtures of polyvinyl acetals and organic polymers, which possess an acid number greater than 71 mg KOH/g have also been described in U.S. Pat. No. 5,143,813. But here, again, incompatibilities and, thus, separation of the mixture can occur during lamination or drying of the photosensitive compositions.

Polymers containing urethane resins have been described as binders for photosensitive compositions U.S. Pat. Nos. 5,206,113, 5,238,772, 5,187,040 and 5,176,985 and U.S. Pat. Nos. 4,983,491, 4,950,582, and 4,877,711). These polyurethane resins contain functional groups (—COOH, —SO$_2$NHCOO—, —CONHSO$_2$NH—) having acidic hydrogen atoms, whose pK$_a$ values in water are not larger than 7. However, functionalization with such hydrophilic groups requires a very large synthesis expense and results in high manufacturing cost.

Despite the intensive research in the field of photosensitive compositions for printing plates, all existing compositions can stand improvement, especially in terms of their developability and sensitivity to printshop chemicals. Again, many of the compositions either have a large number of sometimes expensive ingredients, or the production of their main ingredients involves a large synthesis expense, both of which factors prevent economical applications of the binder composition.

It is therefore an object of the present invention to prepare binders for photosensitive compositions whose production entails the smallest number of synthesis steps possible, as compared to the binders described in the prior art, and which, in photosensitive compositions, nevertheless exhibit the same or (in certain areas) improved physical properties. In particular, these improved properties include, inter-alia, improved ink acceptance and/or a larger print run of the corresponding printing plates ought to be achieved, as compared to the compositions described in the prior art. Yet furthermore, a good developability in developers containing small amounts of organic solvents, salts, and wetting agents, as well as a high photosensitivity and good image resolution, should be retained. Finally, the compositions should be compatible with the other products used in the processing of printing plates.

A further object of the invention is to provide photosensitive compositions containing these binders.

Yet, a further object of the invention is provide printing plates employing such photosensitive compositions.

Other objects and advantages of the invention will become apparent from the following description of embodiments.

SUMMARY OF THE INVENTION

The invention is a binder comprising the recurring units of

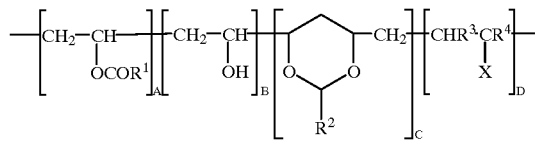

wherein A is present in 0.1 to 25 wt. %; B is present in 10 to 50 wt. %; C is present in 10 to 80 wt. %; D is present in 1 to 40 wt. %; X represents either the group —NHCO—R$^5$ or —CO—NHR$^6$; R$^1$ is a hydrogen atom or a C$_1$–C$_4$ aliphatic hydrocarbon or aromatic residue; R$^2$ is a hydrogen atom, alkyl, aralkyl, or aryl residue; R$^3$ and R$^4$ are independently selected from a hydrogen atom, C$_1$–C$_{10}$ alkyl residues; R$^5$ is selected from a hydrogen atom, C$_1$–C$_{10}$ aliphatic saturated or unsaturated hydrocarbon residue, optionally substituted by a carboxyl group, or an aromatic hydrocarbon residue, which can be substituted by a carboxyl group and other substituents; and R$^6$ is a C$_1$–C$_6$ hydrocarbon residue, optionally substituted by one or more hydroxyl, C$_1$–C$_3$ ether or amino, mono C$_1$–C$_3$ alkylamino, di-C$_1$–C$_3$ alkylamino or carboxyl groups, or an aromatic hydrocarbon residue containing at least one carboxyl or sulfonic acid group, or other substituent.

DESCRIPTION OF THE INVENTION

The advantages of the invention are that it is possible to prepare binders for photosensitive compositions by very simple synthesis, starting with economical and industrially available copolymers. The properties of the binders obtained in this way can be very precisely adjusted by variation of the molar mass and the degree of saponification of the starting copolymers, as well as the nature of the substituents R$^1$ to R$^6$. In this way, one can obtain tailored polymers which are suitable for use in photosensitive compositions, based on different photo-cross-linking mechanisms. It has been possible to significantly improve the developability of such compositions with conventional developers, especially those which are used in the processing of offset printing plates, without any ink acceptance problems occurring. Furthermore, such compositions are very abrasion-resistant after the normal processing steps in the production of offset printing plates, and the plates can be used for print runs with more than 300,000 copies.

The binder according to the invention is a polyvinyl alcohol copolymer, which contains an acid amide group directly bound to the main chain and whose hydroxyl groups are partly acetalized. The structure of the starting ingredients used with special preference to synthesize such products depends on how the acid amide group is bound to the main chain of the polyvinyl alcohol.

If the acid amide group is connected to the main chain by way of nitrogen, i.e., if X corresponds to the structural element —NH—COR$^5$, conventional polymers which contain vinyl alcohol, vinyl acetate and vinyl amine groups will be used preferentially. But it is also possible to use polymers which contain vinyl benzoate groups (R$^1$=C$_6$H$_5$), which may be substituted by alkyl or alkoxy groups. Conversion of these polymers into the binders of the invention takes place in two stages.

In the first stage, the structure —NH—COR$^5$ is created, starting with polymers containing amino groups. For this, one preferably starts with acid halides R$^5$COX (X=Cl, Br), carboxylic acid anhydrides R$^5$—CO—OCO—R$^5$ or intramolecular, cyclical carboxylic acid anhydrides of formula I.

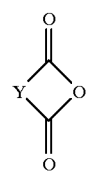

Especially suitable acid halides are of the formula R$^5$COX (X=Cl, Br) or carboxylic acid anhydride R$^5$—CO—OCO—R$^5$; however, more preferred are acetic anhydride (R$^5$=CH$_3$) and benzoic anhydride (R$^5$=C$_6$H$_5$)

Suitable as the intramolecular cyclical carboxylic anhydrides of formula I are, for example, maleic anhydride and its derivatives (such as dimethylmaleic anhydride or citraconic anhydride), phthalic anhydride and its substitution products (such as chloro, nitro, or carboxyphthalic anhydride) or hydrogenation products (such as tetrahydrophthalic anhydride), succinic anhydride and derivatives (such as methylsuccinic anhydride), glutaric anhydride and derivatives (such as 3-oxaglutaric anhydride, 3-methylglutaric anhydride, 3,3-tetramethylene glutaric anhydride or camphoric anhydride), naphthalene dicarboxylic anhydrides and their substitution products (such as naphthalene-2,3-dicarboxylic anhydride or naphthalene-1,8-dicarboxylic anhydride), pyridine-2-carboxylic anhydride and its substitution products, pyrazine-2-carboxylic anhydride and its substitution products, furan-2-carboxylic anhydride and its substitution products, thiophene-2-carboxylic anhydride and thiophene-2,5-dicarboxylic anhydride, its substitution products, as well as its wholly or partly hydrogenated derivatives and di- or poly-cyclic anhydrides, which arise by the Diels-Alder reaction of a diene with maleic anhydride (such as addition products of furan, anthracene, cyclohexadiene-1,3, or cyclopentadiene). Especially preferred are maleic, phthalic, tetrahydrophthalic, succinic and 3-oxaglutaric anhydride.

For certain applications, it can be advantageous to introduce two different —NH—$COR^5$ structures into the polymer, for example, by selecting the molar relationship between anhydride $R^5$—CO—OCO—$R^5$ and intramolecular cyclical carboxylic anhydride of formula I, it is easy to adjust the desired acid number of the polymer.

The conversion is preferably done at temperatures between 10 and 60° C. in a solvent compatible with the starting polymer. Preferable solvents are tetrahydrofuran, 1,4-dioxane, 1,3-dioxolane, hexamethylphosphoryl triamide, N-methylpyrrolidone, formamide, N,N-dimethylformamide, dimethylsulfoxide, and mixtures of water and isopropanol.

In order to isolate the resulting intermediate product of this first step in solid form, the polymer solution may be introduced into a nonsolvent for the polymer while stirring. The intermediate product is then filtered off, and dried. Suitable as nonsolvents for the polymer are nonpolar solvents such as water. In most instances, however, it is not preferable to isolate the product, but rather continue with the next processing step in the chosen solvent.

In the second stage, the aforesaid polymer acid amides are partly acetalized with aldehydes. This reaction occurs by familiar standard procedures for polyvinyl acetal synthesis using catalytic quantities of a mineral acid; examples of which are described in U.S. Pat. No. 4,665,124 and British Patent GB 2 007 677 B. The catalytic quantity of mineral acid added is between 1 and 15 wt. %, in terms of the total quantity of reaction partners.

The acetal residues $R^2$ can be inserted into the polymer molecule from aldehydes $R^2CHO$ or acetals of these aldehydes $R^2CH(OR^7)_2$, wherein $R^7$ represents a lower alkyl residue. The residue $R^2$ is a branched or unbranched alkyl residue with preferably 1 to 10 carbon atoms or an aromatic residue (for example, $R^2=C_6H_5$), which can also be substituted by methyl, carboxyl or methoxy groups. Especially preferred is a synthesis based on acetaldehyde, propionaldehyde, and butyraldehyde or their acetals from lower alcohols ($R^7OH$).

The reaction can occur either in the solvent used for the first stage or in an organic solvent suitable for vinyl alcohol/ vinyl acetate copolymers (see brochure, *Mowiol Polyvinyl Alcohol*, Hoechst AG, pg. C13 (1991)). Especially preferred solvents include dimethylsulfoxide, water combined with a surfactant or a mixture of water and hydroxyl group solvents, such as ethanol, n-propanol or iso-propanol, more preferred is a is a mixture of n-propanol and water (2:1 parts by weight). The concentration of the reaction partners in terms of the quantity of solvent is 3–25 wt. %, especially preferred being 7–16 wt. %. The reaction is generally carried out at temperatures between 0 and 80° C. After the reaction is over, the quantity of mineral acid can, but need not be, neutralized by adding molar amounts of an alkaline salt, such as sodium and potassium carbonate, in order to prevent an acid-catalyzed hydrolysis or acetal cleavage of the polymer binder during storage or later use. Sodium or potassium hydroxide are also suitable for the neutralization.

If the solvent is suitably chosen, the intermediate acetalization product will be insoluble in the solvent and form a precipitate. In another embodiment, the polymer solution is introduced into a nonsolvent in order to isolate the acetalization product in solid form. Water is especially suitable as nonsolvent for the polymer. Another equally practicable procedure is to add the nonsolvent for the polymer to the synthesis solution while stirring. Water is a preferred nonsolvent in this procedure. In both cases, however, there must be intense mixing in order to obtain an easily manipulated reaction product and separate as much of the byproducts as possible. The precipitated product once separated, is washed with water, then air dried at 30 to 70° C.

If the binding of the acid amide group to the polymer main chain occurs across the carbonyl carbon, i.e., X corresponds to the structural element —CO—$NHR^6$, copolymers of vinyl esters and unsaturated carboxylic acids will serve as starting products for the preparation of the polymers according to the invention. The preferred vinyl ester is vinyl acetate (in the polymer according to the invention, this leads to $R^1=CH_3$), but vinyl benzoate (yielding $R^1=C_6H_5$) or its substitution products with alkyl or alkoxy groups can also be used. Especially preferred comonomers for the vinyl esters are acrylic, methacrylic, crotonic, vinyl acetic, itaconic and maleic acids. The desirable proportion of monomers containing carboxyl groups in the polymer molecule and the weight-averaged molar mass of the polymers depend on the intended subsequent use of the photosensitive composition. If the composition will be used to prepare offset printing plates, comonomer proportions which result in an acid number of 10–90 mg KOH/g are preferred, and the polymer binders should have a weight-averaged molar mass ($M_w$) of 20,000 to 130,000 g/mol. The conversion of these copolymers into the polymers of the invention occurs through a three-step reaction sequence involving saponification, acetalization, and aminolysis.

The saponification step is carried out by familiar standard techniques which are familiar to one of ordinary skill in the art, and are described in K. Noro, *Polyvinyl Alcohol Properties and Applications* (ed. C. A. Finch), John Wiley & Sons, London (1973). In the present case, one can employ either an acid-catalyzed or an alkaline-catalyzed saponification. The latter catalyzed reaction is described in UK Patent GB-1 396 355 and performed in a methanol solution with sodium methylate, without significantly influencing the properties of the photosensitive composition. An acid catalyzed saponification is preferred because the saponification product need not be isolated, but rather the solution can be used at once for the acetalization. Furthermore, the degree of hydrolysis of the vinyl ester group in the copolymer, primarily through the reaction temperature and the reaction time, can be varied in this way. Too few vinyl ester groups are saponified at temperatures between 30 and 50° C. or when the reaction time is short. Low degrees of hydrolysis, result in polymers which, after acetalization and aminolysis, yield binders of poor development capability. Degrees of hydrolysis between 75 and 98 wt. % are especially suitable for the production of binders under the invention. The saponified copolymers can be isolated by stirring them into lower alcohols, such as methanol or ethanol. Surprisingly, products prepared by either technique (i.e. alkaline or acid saponification) have an acid number of zero. Analytical studies have shown that the carboxyl groups under the mentioned saponification conditions preferably form lactones with the OH groups of the polymers.

During the second stage, acetalization, the above-mentioned saponification products are reacted with aldehydes or acetals of these aldehydes $R^2CH(OR^7)_2$ to form polyvinyl acetals. This reaction occurs by the procedures described above for the polymer acid amides with structural element —NHCO—$R^5$. In this case, mixtures of alcohols and water are preferred as solvent. The $R^2$ residues are defined as indicated for the polymer acid amides with structural element —NHCO—$R^5$. As the aldehyde $R^2CHO$ for the acetalization of the saponified copolymers, acetaldehyde, propionaldehyde,. or butyraldehyde, or their acetals with lower alcohols, are preferred. Especially preferred is propionaldehyde. In general, the developability of photosensitive compositions from the binders according to the invention become worse with an increasing quantity of aliphatic aldehyde or with an increasing carbon number thereof. But the degree of hydrolysis achieved during the saponification and the molar mass of the starting copolymer, as well-as the substituents $R^6$ at the N-atom, determine the developability of such compositions.

In order to introduce unit C with different alkyl residues, it is possible, but not necessary, to use a mixture of the aforesaid aliphatic aldehydes or their acetals, by which the developability of the photosensitive compositions in particular can be adjusted with great precision.

To minimize the expense of the synthesis, the saponification and acetalization stages can be carried out without isolating the saponification product. One then uses the above-indicated mixtures of water with organic solvents and the necessary quantities of acids for the acetalization, dissolves the copolymers and saponifies them in absence of the aldehydes. After this, the aldehydes are added and the acetalization is carried out. The necessary reaction times and temperatures for the saponification depend on the desired degree of saponification. Uniform reaction temperatures for the saponification and acetalization are preferred.

A simultaneous saponification and acetalization reaction is also possible, i.e., the aldehydes are added from the very beginning. But in this way, it is only possible to obtain polyvinyl acetals with a low degree of acetalization. Polyvinyl acetals prepared by this method likewise possess an acid number of zero.

In the third stage, aminolysis, the above-mentioned polyvinyl acetals are reacted with substituted primary amines. The reaction occurs in an organic solvent which readily dissolves both products, generally within 3 to 5 hours, by heating to 40–80° C. Especially suitable solvents include alcohols (such as, for example, methanol, ethanol, propanol, butanol or glycol ethier), cyclical ethers (such as, for example, tetrahydrofuran, 1,4-dioxane, 1,3-dioxolane), or dipolar aprotic solvents (such as, for example dimethylsulfoxide). The reaction times can be lowered to 1 to 2 hours by adding catalytic quantities of acids, especially preferable being 4-toluene sulfonic acid. The precipitation procedures mentioned for the polyvinyl acetalization are used to isolate the polymers according to the invention. Water is also especially suitable as nonsolvent in this case.

The substituted primary amines necessary for. the synthesis of the polymers according to the invention are defined as indicated above. These are all conventional products. Typical compounds are methylamine, monoethanol amine, 3-hydroxypropylamine, 4-aminobutyric acid, 5-aminohexanoic acid, 4-aminobenzoic acid, 3-aminobenzoic acid, and 4-aminobenzene sulfonic acid. But these are not exclusive examples of reaction partners for the aminolysis of the polyvinyl acetals. The binders obtained with the above-mentioned amines are only especially preferred polymers for the photosensitive compositions which are suitable for the production of offset printing plates. The quantity of amine used depends on the molar portion of the unsaturated carboxylic acid comonomer in the starting vinyl ester copolymer. It is selected so that the molar ratio of this monomer and the amine is between 0.5 and 1.1 (in terms of the amine). Higher amounts of amine result in a distinct decarboxylation of the vinyl ester unit.

The polymers obtained by using amines substituted with carboxylic or sulfonic acid groups have an acid number different from 0. The acid number of the binder depends substantially on the acid number of the starting copolymer, the molar ratio of the reaction partners in the aminolysis stage, and the structure of the amine. Such binders confer an especially favorable developability on photosensitive compositions.

The three stages can also be performed without isolating the particular intermediate stage products. For this, the acid content of the reaction medium in the aminolysis stage must be lowered until the amine used is not entirely protonized. When using aqueous-alcoholic solvents and aminocarboxylic acids as the amine component, this is predominately the case for pH values between 3 and 5.

In addition to the binder, in order to prepare a photosensitive composition, a second essential ingredient is required, namely, a diazonium polycondensation product or a radical-polymerizable system consisting of photoinitiators and unsaturated compounds or a hybrid system of the two.

Suitable diazonium polycondensation products for photosensitive compositions include diazonium polycondensation products familiar to those of ordinary skill in the art. Such condensation products can be prepared, for example, by condensing a diazomonomer, as described in European Patent EP-A-0 104 863, with a condensation agent such as formaldehyde, acetaldehyde, propionaldehyde, butyraldehyde, isobutyraldehyde, or benzaldehyde. benzaldehyde. Furthermore, mixed condensation products are used, containing besides the diazonium salt units also other nonphotosensitive units which are derived from condensable compounds, especially aromatic amines, phenols, phenol ethers, aromatic thioethers, aromatic hydrocarbons, aromatic heterocyclic compounds, and organic acid amides. Especially advantageous examples of the diazonium polycondensation products are reaction products of diphenylamine-4-diazonium salts, possibly containing a methoxy group in the phenyl residue carrying the diazo-group, with formaldehyde or 4,4'-bis-methoxymethyldiphenyl ether. Especially suitable as the anion of these diazo-resins are aromatic sulfonates, such as 4-tolylsulfonate or mesitylene sulfonate, tetrafluoroborate, hexafluoroantimonate, hexafluoroarsenate or hexafluorophosphate. The diazonium polycondensation product is preferably present in a proportion of 3 to 60 wt. % and the radical-polymerizable components is present in a proportion of 5 to 80 wt. %, in terms of the total solid content of the photosensitive compositions.

The radical-polymerizable system, will be composed of photoinitiators which preferably absorb in the range of 300 to 800 nm, especially 300 to 450 nm. Preferably the photoinitiators are selected from the parent substances or derivatives of acetophenone, benzophenone, 2,4-(trichlormethyl)-1,3,5-triazine, benzoin, benzoin ethers, benzoin ketals, xanthone, thioxanthone, acridine or hexaarylbisimidazole. The radical-polymerizable component of the composition according to the invention is an unsaturated compound such as acrylic or methacrylic acid derivative with one or more unsaturated groups. Preferred are esters of acrylic or methacrylic acid in the form of monomers, oligomers, or prepolymers. It can be present in solid or liquid form, while solid and viscous forms are preferred. The compounds which are suitable as monomers include, for example, trimethylol propane triacrylate and methacrylate, pentaerythrite triacrylate and methacrylate, dipentaerythrite monohydroxypentaacrylate and methacrylate, dipentaerythrite hexaacrylate and methacrylate, pentaerythrite tetraacrylate and methacrylate, ditrimethylol propane tetraacrylate and methacrylate, diethylene glycol diacrylate and methacrylate, triethylene glycol diacrylate and methacrylate or tetraethylene glycol diacrylate and methacrylate. Suitable oligomers and prepolymers are urethane acrylates and methacrylates, epoxy acrylates and methacrylates, polyester acrylates and methacrylates, polyether acrylates and methacrylates or unsaturated polyester resins. The photoinitiators and radical-polymerizable components are prepared in the manner familiar to one of ordinary skill in the art, wherein combinations of different photoinitiators and different radical-polymerizable components are also advantageous. Preferably, the weight proportion of the photoinitiators is 0.5 to 20 wt. %, in terms of the total solid content of the photosensitive compositions.

A combination of the diazonium polycondensation products with a radical-polymerizable system consisting of photoinitiators and unsaturated compounds can be advantageous for certain applications. Such hybrid systems consist preferably of 1 to 50 wt. % of diazonium polycondensation product, 0.5 to 20 wt. % of photoinitiators, and 5 to 80 wt. % of radical-polymerizable unsaturated compounds, in terms of the photosensitive composition.

The proper composition of the polymer, according to the invention, as prepared by one or both of the above-described primary methods, requires a degree of trial and error to optimize the binder for a particular application. In a manner familiar to those of ordinary skill in the art, the developability, photosensitivity, ink acceptance, and stability during storage under elevated humidity and temperature, of a printing plate made in accordance with the invention, are a function of the polymer composition employed.

Exposure indicators can be used in the photosensitive compositions according to the invention and are familiar to those of ordinary skill in the art. Such indicators are preferably selected from the series of triarylmethane dyes (such as Victoria pure blue BO, Victoria blue R, crystal violet) or azo dyes (such as 4-phenylazodiphenyl amine or 4-N,N-dimethylaminoazobenzene). The exposure indicators are present in the composition in the amount of 0.02 to 10 wt. %, preferably 0.1 to 6 wt. %.

Dyes may also be used to enhance the image contrast. Suitable dyes are those which readily dissolve in the solvent or mixture of solvents used or those which can be introduced as pigment in dispersed form. Suitable contrast dyes are selected from rhodamine dyes, methyl violet, anthraquinone pigments and phthalocyanine dyes or pigments. The dyes are contained in the photosensitive composition in a proportion of 1 to 15 wt. %, preferably 2 to 10 wt. %.

Furthermore, the photosensitive composition, according to the invention, can contain stabilizer acids. Such stabilizing acids are selected from phosphoric, citric, benzoic, m-nitrobenzoic, p-anilinoazobenzene sulfonic, p-toluene sulfonic or tartaric acid. In many formulations, a mixture of several different acids is advantageous. Phosphoric acid is preferably used as the stabilizing acid. The proportion of acid added is preferably 0.2 to 3 wt. %. The photosensitive composition, according to the invention, can also contain a softener. Suitable softeners are selected from dibutylphthalate, triarylphosphate and dioctylphthalate, however, dioctylphthalate is especially preferred. The amounts of softener added are preferably 0.25 to 2 wt. %.

The photosensitive compositions are preferably used to make printing plates. However, they may also be used in graphics materials for producing images on suitable substrates and receiving sheets, for the production of reliefs which can be used as printing forms, screens, and the like, as photohardening lacquers for surface protection, and for the formulation of UV-hardening printing inks.

In order to prepare presensitized planographic printing plates, aluminum as the film substrate is first roughened by brushing in the dry condition, brushing with grinding agent suspensions, or by electrochemical means, e.g., in a hydrochloric acid electrolyte. The roughened plates, possibly anodically oxidized in sulfuric or phosphoric acid, are then subjected to a hydrophilizing after treatment, preferably in aqueous solutions of polyvinyl phosphonic acid, sodium silicate, or phosphoric acid. The details of the aforesaid pretreatment of the substrate are sufficiently known to the practitioner.

The subsequently dried substrates are then coated or layered with the photosensitive compositions of organic solvents or mixtures of solvents, such that the dry weight of the film is preferably contained in the range of 0.5 to 4 $g/m^2$, especially 0.8 to 3 $g/m^2$.

In certain cases, the additional application of an oxygen-blocking cover layer to the photosensitive layer can be advantageous. This is especially favorable in the case of radical-polymerizable systems and in hybrid systems of diazonium polycondensation product and radical-polymerizable systems. Suitable polymers for the cover layer include polyvinyl alcohol, polyvinyl alcohol/polyvinyl acetate copolymers, polyvinyl pyrrolidone, polyvinyl pyrrolidone/polyvinyl acetate copolymers, polyvinyl methyl ether, polyacrylic acid and gelatin. The thicknesses of the oxygen-blocking cover layer are preferably 0.1 to 4 $g/m^2$, especially 0.3 to 2 $g/m^2$.

Printing plates prepared in accordance with the invention are exposed to light and developed in the way familiar to those of ordinary skill in the art. The developed plates are generally treated with a preservative ("rubberizing"). The preservatives consist of aqueous solutions of hydrophilic polymers, wetting agents, and other additives. For certain applications it is favorable to enhance the mechanical strength of the printing films by a heat treatment or combined use of heat and UV light. For this, prior to this treatment, the fully developed plate is first treated with a solution which protects the nonimage areas so that the heat treatment does not cause these areas to accept ink. A suitable solution for this is described, for example, in U.S. Pat. No. 4,355,096.

The following examples illustrate specific aspects of the present invention and are not intended to limit the scope thereof in any respect and should not be so construed.

PREPARATION EXAMPLE 1

10 g of a copolymer (96 mol. % of vinyl alcohol and 4 mol. % of vinyl amine, molecular weight 36,000 g/mol) was dissolved in 80 ml of DMSO at 60° C. The mixture was then cooled to 10° C. and 0.7 g of maleic anhydride (dissolved in 10 ml of DMSO) and 0.9 g of acetic anhydride (dissolved in 10 ml of DMSO) were slowly dripped in. After the addition, the mixture was heated to 50° C. for 30 min. Then, in succession, 2.5 ml of concentrated hydrochloric acid (37 wt. %), 2.4 g of acetaldehyde, and 3.9 g of butyraldehyde, dissolved together in 10 ml of DMSO, were dripped in over the course of 30 minutes. The mixture was stirred for 1 hour at 50° C. and allowed to cool to room temperature. The polymer was precipitated in water, washed until neutral, and dried for 24 hours at 40° C. The acid number ascertained was 27 mg KOH/g.

PREPARATION EXAMPLE 2

10 g of a copolymer (96 mol. % of vinyl alcohol and 4 mol. % of vinyl amine, molecular weight 36,000 g/mol) was dissolved in 80 ml of DMSO at 60° C. The mixture was cooled to 10° C. and 0.7 g of maleic anhydride (dissolved in 10 ml of DMSO) and 2.2 g of benzoic anhydride (dissolved in 10 ml of DMSO) were slowly dripped in. After the addition, the mixture was heated to 50° C. for 30 minutes. Then, in succession, 2.5 ml of concentrated hydrochloric acid (37 wt. %), 1.44 g of acetaldehyde, and 2.35 g of butyraldehyde, dissolved together in 10 ml of DMSO, were dripped in over the course of 30 minutes. The mixture was stirred for 1 hour at 50° C. and allowed to cool to room temperature. The polymer was precipitated in water, washed until neutral, and dried for 24 hours at 40° C. The acid number ascertained was 25 mg KOH/g.

PREPARATION EXAMPLE 3

10 g of a copolymer (96 mol. % of vinyl alcohol and 4 mol. % of vinyl amine, molecular weight 36,000 g/mol) was dissolved in 80 ml of DMSO at 60° C. The mixture was cooled to 10° C. and 0.7 g of maleic anhydride (dissolved in 10 ml of DMSO) and 0.9 g of benzoic anhydride (dissolved in 10 ml of DMSO) were slowly dripped in. After the addition, the mixture was heated to 50° C. for 30 minutes. Then, in succession, 2.5 ml of concentrated hydrochloric acid (37 wt. %), and 5 g of butyraldehyde in 10 ml of DMSO, were dripped in over the course of 30 minutes. After the addition, the mixture was stirred for 1 hour at 50° C. and allowed to cool to room temperature. The polymer was precipitated in water, washed until neutral, and dried for 24 hours at 40° C. The acid number ascertained was 28 mg KOH/g.

PREPARATION EXAMPLE 4

10 g of a copolymer (96 mol. % of vinyl alcohol and 4 mol. % of vinyl amine, molecular weight 36,000 g/mol) was dissolved in 160 ml of n-propanol at 60° C. The mixture was cooled to 10° C. and 0.7 g of maleic anhydride and 0.9 g of acetic anhydride (dissolved together in 10 ml of tetrahydrofuran) were slowly dripped in. After the addition, the mixture was heated to 50° C. for 30 minutes. Then, in succession, 2 ml of concentrated hydrochloric acid (37 wt. %), and 5 g of butyraldehyde dissolved in 10 ml of n-propanol, were dripped in over the course of 30 minutes. After the addition, the mixture was stirred for 1 hour at 50° C. and allowed to cool to room temperature. The polymer was precipitated in water, washed until neutral, and dried for 24 hours at 40° C. The acid number ascertained was 30 mg KOH/g.

PREPARATION EXAMPLE 5

(Based on GB-1 396 355)

50 g of Mowilith Ct5$^R$ (vinyl acetate/crotonic acid copolymer, available from the Hoechst Co.), along with 6 wt. % of crotonic acid units, having an acid number of around 40 mg KOH/g) were completely dissolved into 450 ml of anhydrous methanol by heating. Next, a solution prepared from 1 g of metallic sodium and 20 ml of anhydrous methanol was added. The mixture was heated to a boil for 30 minutes, keeping out all moisture. The precipitated sediment was filtered off, washed with methanol, and dried at room temperature. The resulting product, using traditional methods, was found to have a vinyl alcohol content of 74 wt. % and an acid number for the resulting product was 0 mg KOH/g.

PREPARATION EXAMPLE 6

50 g of the polymer (per Preparation Example 5) in a mixture of 350 ml of n-propanol and 150 ml of water was agitated at 70° C. for 1 hour. After this, 10.5 g of concentrated hydrochloric acid was added and a solution of 22.3 g of butyraldehyde (dissolved in 20 ml of n-propanol) was dripped in under intense stirring over the course of 45 minutes. The reaction mixture was stirred for 3.5 hours at 70° C. The product was precipitated by dripping in 3 liters of water, filtered off, intensively washed with water, and dried for 2 days at around 40° C. The yield was 96%, in terms of the polymer used according to Preparation Example 5. The content of vinyl alcohol units was 21 wt. % and vinyl acetate units was 6.5 wt. %. The acid number for the resulting product was 0 mg KOH/g.

PREPARATION EXAMPLE 7

As described in Preparation Example 6, a solution of 50 g of the polymer was prepared in a mixture of 300 ml of n-propanol and 150 ml of water. Then 9 g of concentrated hydrochloric acid was added. After this, 18.6 g of propionaldehyde at 60° C. was dripped over 30 minutes and the mixture was stirred for 3 hours. After cooling, the reaction mixture was neutralized with a solution of 9.6 g of sodium carbonate in 30 ml of water. The polymer binder was precipitated by stirring in 3 liters of water, filtered off, washed intensively with water, and dried at approximately 40° C. for 24 hours. The yield was 94%, in terms of the polymer used according to Preparation Example 5, and the content of vinyl alcohol units was 23.4 wt. %. The acid number for the resulting product was 0 mg KOH/g.

PREPARATION EXAMPLE 8

The preparation followed the Preparation Example 6 except, 50 g of the polymer from Preparation Example 5, 11.2 g of butyraldehyde, 6.8 g of acetaldehyde, and 9 g of concentrated hydrochloric acid (30 ml of n-propanol to dissolve the two aldehydes) were used. The yield was 93%, in terms of the product per Preparation Example 5, and the vinyl alcohol content was 27 wt. %. The acid number for the resulting product was 0 mg KOH/g.

PREPARATION EXAMPLE 9

50 g of Mowilith Ct5$^R$ in a mixture of 300 ml of n-propanol, 150 ml of water, and 8 ml of concentrated hydrochloric acid were stirred for 21 hours at 70° C., until the solution became cloudy. Then, at the same temperature, a mixture of 9.8 g of butyraldehyde, 6 g of acetaldehyde, and 30 ml of n-propanol was dripped in over the course of 1 hour, with stirring for an additional 4 hours. The mixture was then cooled to room temperature and a solution of 9.2 g of sodium carbonate (water-free) in 25 ml of water was added to adjust the pH of the solution to 7. Next, the reaction product was precipitated by adding the mixture into 3 liters of water under intense stirring. The product was separated, intensively washed with water, and dried for two days at roughly 40° C. The yield was 92%, in terms of the Mowilith $Ct5^R$ used, and the vinyl acetate content was 8 wt. %. The acid number for the resulting product was 0 mg KOH/g.

PREPARATION EXAMPLE 10

The procedure of Preparation Example 9 was followed except, the solvent mixture of n-propanol/water was replaced with a mixture of 400 ml of dimethylsulfoxide and 30 ml of water. The polyvinyl acetal resulting had a yield of 90%, in terms of the Mowilith $Ct5^R$ used, and a content of vinyl alcohol units of 19.5 wt. %. The acid number for the resulting product was 0 mg KOH/g.

PREPARATION EXAMPLE 11

The procedure of Preparation Example 9 was followed except, 50 g of Mowilith $Ct5^R$, 10.8 g of butyraldehyde (25 ml of n-propanol to dissolve the aldehyde), and 7.5 g of concentrated hydrochloric acid were employed. The yield was 91%, in terms of the Mowilith $Ct5^R$ used, and the content of vinyl alcohol units was 29 wt. %. The acid number for the resulting product was 0 mg KOH/g.

PREPARATION EXAMPLE 12

The procedure of Preparation Example 9 was followed except, 49 g of a copolymer prepared by boiling for 6 hours 118 g of vinyl acetate and. 9 g of acrylic acid (in 500 ml of methylethylketone) in the presence of 9.6 g of azo-bis-isobutyronitrile was used. The bis-isobutyronitrile was added at intervals of 2 hours then 2 liters of n-hexane (acid number of the product: 36 mg KOH/g), and 10.8 g of butyraldehyde, as well as 6.0 g of concentrated hydrochloric acid were precipitated in. The yield, in terms of the copolymer used, was 92%. The acid number for the resulting product was 0 mg KOH/g.

PREPARATION EXAMPLE 13

20 g of the polymer prepared in Preparation Example 9 was dissolved in 150 ml of methanol under mild heating. Next, 10 g of a 40 wt. % solution of methylamine in water was added. The mixture was boiled for 4 hours under reflux and stirred into 600 ml of water. The precipitated product was filtered off and dried for 24 hours at 40° C. The acid amide group contained in the polymer was detected by IR at a band of 1640 $cm^{-1}$.

PREPARATION EXAMPLE 14

20 g of the polymer prepared in Preparation Example 10, 3.6 g of 1-aminopropanol-3, 0.4 g of 4-toluene sulfonic acid and 150 ml of ethanol were boiled for 2 hours under reflux. The reaction solution was then stirred into 600 ml of water. The precipitated sediment was filtered off and dried for 24 hours at 40° C. The acid amide group contained in the polymer was detected by IR at a band of 1640 $cm^{-1}$.

PREPARATION EXAMPLE 15

20 g of the polymer prepared in Preparation Example 11 and 2.8 g of 4-aminobenzoic acid were boiled under reflux in 130 ml of ethanol for 5 hours. The solution was allowed to stand at room temperature for 15 hours. The reaction product was isolated by slowly stirring the solution into 750 ml of water and filtering off the sediment which was dried for 24 hours at 40° C. The acid number for the resulting product was 25 mg KOH/g and the content of vinyl alcohol units was 25.4 wt. %.

PREPARATION EXAMPLE 16

The procedure of Preparation Example 15 was followed except, 20 g of the polymer used in Preparation Example 8 and 2.8 g of 4-aminobenzoic acid were used. The acid number for the resulting product was 26 mg KOH/g and the content of vinyl alcohol units was 22.5 wt. %.

PREPARATION EXAMPLE 17

The procedure of Preparation Example 15 was followed except, 20 g of the polymer in Preparation Example 10 and 2.8 g of 3-aminobenzoic acid were used. The precipitation solution was stirred for 5 hours at room temperature before the product was filtered off. The acid number for the resulting product was 18.5 mg KOH/g and the content of vinyl alcohol units was 15.6 wt. %.

PREPARATION EXAMPLE 18

The procedure of Preparation Example 15 was followed except, 20 g of the polymer in Preparation Example 7 and 2.8 g of 4-aminobenzoic acid were used. The acid number for the resulting product was 24 mg KOH/g and the content of vinyl alcohol units was 18.5 wt. %.

PREPARATION EXAMPLE 19

20 g of the polymer prepared in Preparation Example 8, 2.2 g of 4-aminobutyric acid, and 0.4 g of 4-toluene sulfonic acid were heated for 5 hours to boiling. Next, this mixture was added to 130 ml of a mixture of 90 wt. % of ethanol and 10 wt. % of water and allowed to stand at room temperature an additional 20 hours. The mixture was stirred into 700 ml of water. The precipitate was filtered off, and dried at 40° C. for 24 hours to form the product. The acid number for the resulting product was 19 mg KOH/g and the content of vinyl alcohol units was 23 wt. %.

PREPARATION EXAMPLE 20

The procedure of Preparation Example 15 was followed except, 20 g of the polymer in Preparation Example 12 and 2.7 g of 4-aminobenzoic acid were used. The acid number for the resulting product was 27 mg KOH/g and the content of vinyl alcohol units was 23.1 wt. %.

PREPARATION EXAMPLE 21

50 g of Mowilith $Ct5^R$ in a mixture of 300 ml of n-propanol, 150 ml of water, and 6 ml of concentrated hydrochloric acid was stirred for 21 hours at 70° C., whereupon the solution became cloudy. The solution was cooled to 50° C. and a solution of 15.6 g of propionaldehyde (in 30 ml of n-propanol) was dripped in over a 1 hour period. The mixture was stirred for 4 hours, then cooled to room temperature. Next, a solution of 10 g of sodium hydroxide in 50 ml of water was added until the pH of the solution was adjusted to 3. 5.5 g of 4-aminobenzoic acid was then added and the solution was again heated to 60° C. for 3 hours.

The reaction product was precipitated by stirring the mixture into 3 liters of water under intense stirring. The product was separated, intensively washed with water, and dried for two days at roughly 40° C. The yield was 92%, in terms of the Mowilith Ct5$^R$ used, and the vinyl acetate content was 8 wt. %. The acid number for the resulting product was 25 mg 1KOH/g.

PREPARATION EXAMPLE 22

225 ml of water, 450 ml of n-propanol, 75 g of Mowiol 8/88$^R$ (polyvinyl alcohol, available from the Hoechst Co., with a residual acetal group content of around 21 wt. %) were dissolved in a water bath at 70° C. then cooled to 60° C. 10.2 ml of concentrated hydrochloric acid was then added. Next, a mixture of 16.2 g butyraldehyde and 9.9 g acetaldehyde was slowly dripped in the mixture with stirring at 60° C. for 4 hours. For neutralization, 10.6 g of sodium carbonate, dissolved in 50 ml of water, are added and stirred for 30 minutes. The polymer was obtained by slowly pouring the mixture into an excess of water, filtering off the precipitate and drying at 40° C. for 24 hours. The vinyl alcohol units content was 28 wt. %.

PREPARATION EXAMPLE 23

(Based on WO 93/03068)

A mixture of 25 g of Mowiol 5/88$^R$ (polyvinyl alcohol of the Hoechst Co.) with a residual acetal group content of around 21 wt. %), 75 ml of water and 150 ml of n-propanol was stirred at 70° C. for 20 hours. The mixture was cooled to 60° C. 3.4 g of concentrated hydrochloric acid was then added along with a mixture of 5.4 g of benzaldehyde, 7.4 g of butyraldehyde. Then 9 g of 2-phthalaldehyde acid was added over the course of 2 hours. The mixture was kept at 60° C. for 2 hours while stirring. Soda was added until a pH of 7 was obtained. The precipitate was formed in water, washed, and dried at 40° C. for 24 hours. The product obtained had an acid number of 20 mg KOH/g.

PREPARATION EXAMPLE 24

(Based on DE-A-20 533 63)

50 g of Mowital B60T$^R$ (polyvinyl butyral, available from the Hoechst Co. having an acetal content of 70 wt. %, vinyl alcohol content of 26 wt. % and an acetal content of 3 wt. %) was dissolved in 752 g of dried 1,4-dioxane at 40° C. At the same temperature, 27.2 g of 4-toluene sulphonylisocyanate was dripped in over a 20 minute period. The mixture was stirred at 40° C. for 4 hours. The polymer was precipitated in an excess of water. After washing with water, the product was filtered off and dried at 40° C. for 24 hours.

PREPARATION EXAMPLE 25

(Based on EP-A-0 152 819)

25 g of Mowital B60T$^R$ (polyvinyl butyral of the Hoechst Co. with an acetal content of 70 wt. %, vinyl alcohol content of 26 wt. % and an acetal content of 3 wt. %) was dissolved in 700 ml of methylethylketone at 60° C. After adding 10 g of maleic anhydride and 0.7 ml of triethyl amine the mixture was boiled under reflux for 6 hours. By precipitation in water, washing with water, and drying at 40° C. for 24 hours, a product was obtained having an acid number of 58 mg KOH/g.

EXAMPLE 26

A coating solution is prepared from the following components:

| | |
|---|---|
| 2.19 g | binder per Preparation Example 1 |
| 2 g | polycondensation product of 1 mol of 3-methoxydiphenylamine-4-diazonium sulfate and 1 mol of 4,4'-bis-methoxymethyl diphenyl ether, precipitated as mesitylene sulfonate |
| 0.75 g | Renol blue B2G-HW$^R$ (copper phthalocyanine pigment preparation with polyvinyl butyral) |
| 0.025 g | 4-phenylazodiphenylamine |
| 0.035 g | phosphoric acid |

Said components were dissolved while stirring in 100 ml of a mixture consisting of 30 Vol. parts of methyl glycol/45 Vol. parts of methanol/25 Vol. parts of methylethylketone. After filtering the solution, it was applied by usual methods to an electrochemically roughened and anodized aluminum foil, which had been after treated with polyvinyl phosphonic acid, and the layer was dried at 90° C. for 4 minutes. The dry weight of the copying layer was around 1 g/m$^2$. The copying layer was exposed under a silver film half-tone step wedge with a tonal range of 0.15 to 1.95, the density increments being 0.15, as a negative receiver with a metal halide lamp (MH-Brenner, W. Sack Co.) at 300 mJ/cm$^2$.

The exposed layer was treated with a developer solution consisting of 3.4 wt. parts of Rewopol NLS28$^R$ (30% solution of sodium lauryl sulfate in water, available from Rewo Co.)

1.8 wt. parts of 2-phenoxyethanol 1.1 wt. parts of diethanolamine 1.0 wt. parts of Texapon 842$^R$ (42% solution of octyl sulfate in water, from Henkel Co.)

0.6 wt. parts of Nekal BX Paste$^R$ (sodium salt of an alkylnaphthaline sulfonic acid, from BASF Co.)

0.2 wt. parts of 4-toluene sulfonic acid 91.9 wt. parts of water for 30 s (seconds). The developer solution was then rubbed onto the surface an additional 30 s with a tampon and then the entire plate is rinsed off with water. After this treatment, the exposed parts remain on the plate. To assess the photosensitivity and ink acceptance, the plate was blackened with a printing ink in the wet state. As printing ink, products PC 904$^R$ (Polychrome Co.) and RC 43$^R$ (Hoechst Co.) were used. The ink acceptance of the plate was good with both inks and exposed microlines are reproduced very well. The gray wedge was completely covered up to step 5 and partly up to step 9.

In order to check the developability of the non-exposed layer and compare it with other formulations, the following procedure was used: at time intervals of 5 s, the coated aluminum foil was loaded with the above developer solution in strips, using a pipette. After the developer worked on the first strip for 30 s, the entire foil was quickly and uniformly rinsed off under watering. One half of the foil was then blackened with printing ink and the foil was then dried. The time of the developer action (hereafter known as the drop test) was determined, after which the layer on the nonblackened half was totally removed from the foil or after which no ink acceptance was found on the blackened half. In both cases, this amounts to 10 s.

To prepare a printing plate, a copying layer was applied to the aluminum foil as indicated above, exposed, and developed. The developed plate, after rinsing with water, was wiped off and rubbed down with an aqueous solution of 0.5% phosphoric acid and 6% gum arabic. The plate, used in a sheet offset printing machine, and under normal printing conditions, produced 180,000 copies of good quality. It was possible to use the plate for further printing.

EXAMPLE 27

Example 26 was repeated, but instead of the polymer per Preparation Example 1, that from Preparation Example 2 was used and processed. The resulting copying layer in the blackened condition furnished a firm step of 5 and still covered step 8. No ink acceptance problems occurred. The drop test for both cases was 10 s. The printing plate, used in a sheet offset printing machine, revealed no apparent wear after a run of 150,000 copies.

EXAMPLE 28

Example 26 was repeated, but instead of the polymer of Preparation Example 1, that from Preparation Example 3 was used and processed. The resulting copying layer in the blackened condition furnished a firm step of 5 and still covered step 7. No ink acceptance problems occurred. The drop test for both cases was 10 s. The printing plate, used in a sheet offset printing machine, revealed no apparent wear after a run of 150,000 copies.

EXAMPLE 29

Example 26 was repeated, but instead of the polymer per Preparation Example 1, that from Preparation Example 4 was used and processed. The resulting copying layer in the blackened condition furnished a firm step of 3 and still covered step 7. No ink acceptance problems occurred. The drop test for both cases was 10 s. The printing plate, used in a sheet offset printing machine, revealed no apparent wear after a run of 150,000 copies.

EXAMPLE 30

A coating solution is prepared from the following components:

| | |
|---|---|
| 3.2 g | polymer per Preparation Example 15 |
| 2.5 g | of a polycondensation product of 1 mol of 3-methoxydi-phenylamine-4-diazonium sulfate and 1 mol of 4,4'-bis-methoxymethyldiphenyl ether, precipitated as mesitylene sulfonate |
| 0.75 g | Renol blue B2G HW$^R$ (copper phthalocyanine pigment preparation with polyvinyl butyral) |
| 0.1 g | 4-phenylazodiphenylamine |
| 0.1 g | phosphoric acid (85%). |

The mentioned components were dissolved as indicated in Example 26, processed into a printing plate, and tested. The resulting copying layer in the blacked-in condition furnished a solid step of 3 and still covered step 9. No ink acceptance problems occurred. The drop test for both cases was 10 s. The printing plate, used in a sheet offset printing machine, revealed no apparent wear after a run of 180,000 copies.

EXAMPLE 31

Example 30 was repeated, but instead of the polymer of Preparation Example 15, that from Preparation Example 17 was used and processed. The resulting copying layer in the blackened condition furnished a firm step of 3 and still covered step 9. No ink acceptance problems occurred. The drop test for both cases was 15 s. The printing plate, used in a sheet offset printing machine, revealed no apparent wear after a run of 140,000 copies.

EXAMPLE 32

Example 30 was repeated, but instead of the polymer from Preparation Example 15, that of Preparation Example 12 was used and processed. The composition of the coating solution by weight and its further processing were not changed. The copying layers according to the invention, after being blacked-in, exhibited a solid step of 2 and covered step of 8. The blacking was uniform with both inks. The drop test was 15 s for both cases. The printing plate, used in a sheet offset printing machine, yielded a run of 130,000 copies and was still usable for further printing.

EXAMPLE 33

A coating solution was made from the following components:

| | |
|---|---|
| 4.3 g | polymer per Preparation Example 16 |
| 1.8 g | a polycondensation product of 1 mol of 3-methoxydiphenylamine-4-diazonium sulfate and 1.2 mol of formaldehyde, precipitated as hexafluorophosphate |
| 0.2 g | Victoria pure blue BO |
| 0.1 g | phosphoric acid (85%) | and the solvent mixture from Example 26, following the procedures as indicated there. The dry weight of the copying layer was around 1.1 g/m$^2$. The ink acceptance of the plate was good and exposed microlines were reproduced very well. The gray wedge was complete up to step 4 and steps up to 10 were partly covered. The drop test was 5 s for both cases. The printing plate furnished 100,000 copies in good quality and it was possible to use the plate for further printing.

EXAMPLE 34

A coating solution was made from the following components:

| | |
|---|---|
| 4.1 g | polymer per Preparation Example 14 |
| 1.1 g | a polycondensation product of 1 mol of 3-methoxy-diphenyl-4-diazonium sulfate and 1 mol of 4,4'-bis-methoxy-methyldi-phenylether, precipitated as 4-tolylsulfonate |
| 0.2 g | OB 613$^R$ (Orient Chemical Industry Co.) |
| 0.1 g | phosphoric acid (85%) | and the solvent mixture from Example 26, following the procedures as indicated there. The copying layers with this formulation according to the invention had a drop test of 10 s for both cases, a solid step of 2 in the blacked-in condition and covered steps as far as 9. The printing plate, used in a sheet offset printing machine, furnished 140,000 copies of good quality under normal printing conditions with no significant signs of wear.

EXAMPLE 35

A coating solution was made from the following components:

| | |
|---|---|
| 5.2 g | polymer per Preparation Example 18 |
| 2.8 g | of an 80% solution of a urethane acrylate in methylethyl ketone, prepared by reaction of 1-methyl-2,4-bis-isocyanatobenzene (flesmodur N100$^R$ of the Bayer Co.) with hydroxyethyl acrylate and |

-continued

| | |
|---|---|
| | pentaerythritol triacrylate with a double bond content of 0.50 double bonds per 100 g at complete conversion of the isocyanate group |
| 1.4 g | dipentaerythritol pentaacrylate |
| 0.17 g | 2-(4-methoxynaphthyl-1-yl)-4,6-bis-(trichlormethyl)-s-triazine |
| 0.3 g | polycondensation product of 1 mol of 3-methoxy-diphenyl amine-4-diazonium sulfate and 1 mol of 4,4'-bis-methoxy methyldiphenyl ether, precipitated as mesitylene sulfonate |
| 0.2 g | Victoria pure blue BO |
| 0.1 g | phosphoric acid (85%) |

The mentioned components were dissolved while stirring in 100 ml of a mixture consisting of 30 Vol. parts methyl glycol/45 Vol. parts methanol/25 Vol. parts methylethylketone. After filtering the solution, it was applied by usual conventional methods to an electrochemically roughened and anodized aluminum foil, which was aftertreated with an aqueous solution polyvinyl phosphonic acid, and the layer was dried for 4 minutes at 90° C. The dry weight of the copying layer was around 1 g/m². After this, an oxygen blocking layer of 0.4 g/m² dry weight was applied in similar fashion by coating with a solution of 50 g Polyvinyl-alcohol (Airvol 203$^R$ of the Air Products Co.; 12 wt. % residual acetal groups) and 170 g water. Drying was done for 5 minutes at 95° C.

The plate was then exposed, developed, blacked and printed in the manner described in Example 26. The drop test of the copying layer was 10 s for both cases. The ink acceptance of the plate was good and exposed microlines were reproduced very well. The second step of the gray wedge was completely covered and the steps up to 10 were partially covered.

The printing plate, used in a sheet offset printing machine, furnished 100,000 copies of good quality under normal printing conditions and was still usable for further printing.

EXAMPLE 36

A coating solution was prepared from the following components:

| | |
|---|---|
| 3.3 g | polymer per Preparation Example 19 |
| 4.7 g | of an 80% solution of a urethane acrylate prepared by reaction of 1-methyl-2,4-bis-isocyanatobenzene (Desmodur N100$^R$ of the Bayer Co.) with hydroxyethyl acrylate and pentaerythritol triacrylate with a double bond content of 0.50 double bonds per 100 g at complete conversion of the isocyanate groups |
| 0.17 g | 2-(4-methoxynaphthyl-1-yl)-4,6-bis-(trichlormethyl)-1,3,5-triazile |
| 0.16 g | 4,4'-N,N-diethylaminobenzophenone |
| 0.19 g | 3-mercapto-1,2,4-triazole |
| 0.12 g | Congo red |
| 0.2 g | Leucocrystal violet |

The mentioned components were dissolved while stirring in 100 ml of a mixture consisting of 35 Vol. parts methyl glycol/25 Vol. parts methanol/40 Vol. parts methylethylketone. After filtering, the solution was applied by usual conventional methods to an electrochemically roughened and anodized aluminum foil, which was aftertreated with an aqueous solution polyvinyl phosphonic acid, and the layer was dried for 4 minutes at 90° C. The dry weight of the copying layer was around 2.0 g/m². After this, an oxygen blocking layer of 1.8 g/m² dry weight was applied in similar fashion by coating with a solution of 50 g Polyvinyl alcohol (Airvol 203$^R$ of the Air Products Co.; 12 wt. % residual acetal groups) and 270 g water. Drying was done for 5 minutes at 90° C.

The plate was exposed in the manner described in Example 26, but with a light energy of 20 mJ/cm². Immediately after the exposure, the plate was heated to 95° C. for 1 minute to intensify the photopolymerization. The development and blacking were done in the manner described in Example 26. The drop test of the copying layer was 10 s for both cases. The ink acceptance of the plate was good. The first step of the gray wedge was completely covered and the steps up to 6 were partially covered. The printing plate, used in a sheet offset printing machine, furnished 100,000 copies of good quality under normal printing conditions and was still usable for further printing.

EXAMPLE 37

Comparative

A coating solution was prepared from the following components:

| | |
|---|---|
| 3.2 g | polymer per Preparation Example 11 |
| 2.5 g | of a polycondensation product of 1 mol of 3-methoxydi phenylamine-4-diazonium sulfate and 1 mol of 4,4'-bis-methoxymethyldiphenyl ether, precipitated as mesitylene sulfonate |
| 0.75 g | Renol blue B2G HW$^R$ (copper phthalocyanine pigment preparation with polyvinyl butyral, from Hoechst Co.) |
| 0.1 g | 4-phenylazodiphenylamine |
| 0.1 g | phosphoric acid (85%). |

The mentioned components were dissolved, while stirring in 100 ml of a mixture consisting of 45 Vol. parts methyl glycol/30 Vol. parts methanol/25 Vol. parts methylethylketone. After filtering, the solution was applied by usual conventional methods to an electrochemically roughened and anodized aluminum foil, which was aftertreated with an aqueous solution polyvinyl phosphonic acid, and the layer was dried for 4 minutes at 90° C. The dry weight of the copying layer was around 1 g/m². The drop test of the layer was 30 s for the nonblackened part and 25 s for the blacked part.

The plate was exposed, developed, blacked and printed in the manner described in Example 26. The ink acceptance of the plate was good and exposed microlines were well reproduced. The second step of the gray wedge was completely exposed up to step 2 and partly covered up to step 8. There were distinct signs of wear in the full surfaces and raster points within 120,000 copies. The results show that a significant improvement in the application features occurs based on the introduction of acid amide groups per Preparation Example 15 and the application per Example 30.

EXAMPLE 38

Comparative

A coating solution was prepared from the following components:

| | |
|---|---|
| 4.38 g | polyvinyl butyral with a mean molecular weight of 30,000, which contains 70 wt. % of butyral units, 27 wt. % of vinyl alcohol units, and 3 wt. % of vinyl acetate units |
| 4 g | polycondensation product of 1 mol of 3-methoxydiphenylamine-4-diazonium sulfate and 1 mol |

| | |
|---|---|
| | of 4,4'-bis-methoxymethyldiphenyl ether, precipitated as mesitylene sulfonate |
| 1.5 g | Renol blue B2G-HW$^R$ (copper phthalocyanine pigment preparation with polyvinyl butyral of Hoechst Co.) |
| 0.05 g | 4-phenylazodiphenylamine |
| 0.07 g | phosphoric acid |

Said components were dissolved while stirring in 200 ml of a mixture consisting of 30 Vol. parts of methyl glycol/45 Vol. parts of methanol/25 Vol. parts of methylethylketone. After filtering, the solution was applied by usual method to an electrochemically roughened and anodized aluminum foil, which had aftertreated with an aqueous solution of polyvinyl phosphonic acid, and the layer was dried at 90° C. for 4 minutes. The dry weight of the copying layer was around 1 g/m². The plate was exposed, developed and blacked as described in Example 26. The printing plate proved very hard to develop. only with a strong mechanical support was it possible to eliminate nonexposed areas of adhering layer residues. The nonexposed parts of the layer were sometimes insoluble in the developer and had a tendency to form deposits on the plate and in the developing machines. The resolution capacity was poor, since the spaces between fine details were not cleanly developed.

EXAMPLE 39

Comparative

A coating solution was prepared from the following components:

| | |
|---|---|
| 4.38 g | binder per Preparation Example 22 |
| 4 g | polycondensation product of 1 mol of 3-methoxydiphenylamine-4-diazonium sulfate and 1 mol of 4,4'-bis-methoxymethyl diphenyl ether, precipitated as mesitylene sulfonate |
| 1.5 g | Renol blue B2G-HW$^R$ (copper phthalocyanine pigment preparation with polyvinyl butyral of Hoechst Co.) |
| 0.05 g | 4-phenylazodiphenylamine |
| 0.07 g | phosphoric acid |

Said components were dissolved while stirring in 200 ml of a mixture consisting of 30 Vol. parts of methyl glycol/45 Vol. parts of methanol/25 Vol. parts of methylethylketone. After filtering, the solution was applied by usual method to an electrochemically roughened and anodized aluminum foil, which had been aftertreated with an aqueous solution of polyvinyl phosphonic acid, and the layer was dried at 90° C. for 4 minutes. The dry weight of the copying layer was around 1 g/m².

The plate was exposed, developed and blacked as described in Example 26. The reproduction of fine raster points was adequate. The first step of the gray wedge was completely and steps up to 7 are partly covered. However, the sensitivity was much lower than that of printing plates prepared in accordance with the invention. To simulate an aging of the plate, it was kept for 10 days at a temperature of 40° C. and at 80% relative humidity. The printing plate, used in a sheet offset machine, under normal printing conditions, exhibited heavy wear of the full surfaces after only 50,000 copies.

EXAMPLE 40

Comparative

A coating solution was prepared from the following components:

| | |
|---|---|
| 5.43 g | binder per Preparation Example 23 |
| 4.0 g | polycondensation product of 1 mol of 3-methoxydiphenylamine-4-diazonium sulfate and 1 mol of 4,4'-bis-methoxymethyl diphenyl ether, precipitated as mesitylene sulfonate |
| 0.5 g | Victoria pure blue (C.I. Solvent Blue 5) |
| 0.07 g | phosphoric acid |

Said components were dissolved while stirring in 200 ml of a mixture consisting of 30 Vol. parts of methyl glycol/45 Vol. parts of methanol/25 Vol. parts of methylethylketone. After filtering, the solution was applied by usual method to an electrochemically roughened and anodized aluminum foil, which had been aftertreated with an aqueous solution of polyvinyl phosphonic acid, and the layer was dried at 90° C. for 4 minutes. The dry weight of the copying layer was around 1 g/m². The plate was exposed, developed and blacked as described in Example 26.

The first two steps of the gray wedge were completely covered and steps up to 7 were partly covered. However, the sensitivity is much lower than that of the polymers of the invention. Furthermore, the plate required at least 15 seconds to develop, as compared to 5 seconds under the invention. In fast developer machines and developers near depletion, this would result in the plate not being cleanly developed.

EXAMPLE 41

Comparative

A coating solution was prepared from the following components:

| | |
|---|---|
| 6.38 g | binder per Preparation Example 24 |
| 2 g | polycondensation product of 1 mol of 3-methoxydiphenylamine-4-diazonium sulfate and 1 mol of 4,4'-bis-methoxymethyldi phenyl ether, precipitated as mesitylene sulfonate |
| 1.5 g | Renol blue B2G-HW$^R$ (copper phthalocyanine pigment preparation with polyvinyl butyral of Hoechst Co.) |
| 0.05 g | 4-phenylazodiphenylamine |
| 0.07 g | phosphoric acid |

Said components were dissolved while stirring in 200 ml of a mixture consisting of 30 Vol. parts of methyl glycol/45 Vol. parts of methanol/25 Vol. parts of methylethylketone. After filtering, the solution was applied by usual method to an electrochemically roughened and anodized aluminum foil, which had been aftertreated with an aqueous solution of polyvinyl phosphonic acid, and the layer was dried at 90° C. for 4 minutes. The dry weight of the copying layer was around 1 g/m². The plate was exposed, developed and blacked as described in Example 26.

The ink acceptance of the plate was worse than that of printing plates made in accordance with the invention. The first two steps of the gray wedge were completely covered and the steps up to 8 were partly covered. The printing plate, used in a sheet offset machine, exhibited heavy losses of microelements and showed signs of wear in the full surfaces after 100,000 copies under normal printing conditions.

EXAMPLE 42

Comparative

A coating solution was prepared from the following components:

| | |
|---|---|
| 5.85 g | polymer per Preparation Example 25 (per EP 0 152 819) |
| 3 g | polycondensation product of 1 mol of 3-methoxydiphenylamine-4-diazonium sulfate and 1 mol of 4,4'-bis-methoxylethyldi phenyl ether, precipitated as mesitylene sulfonate |
| 1 g | Renol blue B2G HW$^R$ (copper phthalocyanine pigment preparation with polyvinyl butyral of Hoechst Co.) |
| 0.05 g | 4-phenylazodiphenylamine |
| 0.1 g | phosphoric acid |

Said components were dissolved while stirring in 200 ml of a mixture consisting of 30 Vol. parts of methyl glycol/45 Vol. parts of methanol/25 Vol. parts of methylethylketone. After filtering, the solution was applied by usual method to an electrochemically roughened and anodized aluminum foil, which had been aftertreated with an aqueous solution of polyvinyl phosphonic acid, and the layer was dried at 90° C. for 4 minutes. The dry weight of the copying layer was around 1 g/m$^2$. The plate was exposed, developed and blacked as described in Example 26.

The reproduction of fine raster points was only adequate. The first step of the gray wedge was completely covered and steps up to 7 were partly covered. However, the sensitivity was much lower than that of plates made under the invention.

EXAMPLE 43

Comparative

A coating solution was prepared from the following components:

| | |
|---|---|
| 5.45 g | Scripset 540$^R$ (butyl semi-ester of maleic anhydride/styrene copolymers of Monsanto Co.) |
| 4 g | polycondensation product of 1 mol of 3-methoxydiphenylamine-4-diazonium sulfate and 1 mol of 4,4'-bis-methoxymethyldi phenyl ether, precipitated as mesitylene sulfonate |
| 0.5 g | Victoria pure blue (C.I. Solvent Blue 5) |
| 0.05 g | phosphoric acid |

Said components were dissolved while stirring in 100 ml of a mixture consisting of 30 Vol. parts of methyl glycol/45 Vol. parts of methanol/25 Vol. parts of methylethylketone. After filtering, the solution was applied by usual method to an electrochemically roughened and anodized aluminum foil, which had been aftertreated with an aqueous solution of polyvinyl phosphonic acid, and the layer was dried at 90° C. for 4 minutes. The dry weight of the copying layer was around 1 g/m$^2$. The plate was exposed, developed and blacked as described in Example 26. The ink acceptance during manual blacking of the plate was insufficient and exposed microlines were poorly reproduced. The first step of the gray wedge was completely covered and steps up to 7 were partly covered.

The printing plate, used on a sheet offset machine, accepted ink poorly during printing and the ink acceptance of the full surfaces was particularly spotty. clear signs of wear evident in the full surfaces and raster points after 100,000 copies.

EXAMPLE 44

Comparative

A coating solution was prepared from the following components:

| | |
|---|---|
| 5.45 g | CAP$^R$ (cellulose-acetate/phthalate (available from Eastman Kodak Co.) |
| 4 g | polycondensation product of. 1 mol of 3-methoxydiphenylamine-4-diazonium sulfate and 1 mol of 4,4'-bis-methoxymethyldi phenyl ether, precipitated as mesitylene sulfonate |
| 0.5 g | Victoria pure blue (C.I. Solvent Blue 5) |
| 0.05 g | phosphoric acid (85%) |

Said components were dissolved while stirring in 100 ml of a mixture consisting of 30 Vol. parts of methyl glycol/45 Vol. parts of methanol/25 Vol. parts of methylethylketone. After filtering, the solution was applied by usual method to an electrochemically roughened and anodized aluminum foil, which had been aftertreated with an aqueous solution of polyvinyl phosphonic acid, and the layer was dried at 90° C. for 4 minutes. The dry weight of the copying layer was around 1 g/m$^2$. The plate was exposed, developed and blacked as described in Example 26.

The ink acceptance and the sensitivity were insufficient. The first step of the gray wedge was completely covered and steps up to 5 are partly covered. The printing plate, used in a sheet offset machine, accepted ink poorly during printing and the ink acceptance of full surfaces was spotty. Clear signs of wear were evident in the full surfaces and raster points after 60,000 copies.

The present invention has been described in detail, including the preferred embodiments thereof. However, it will be appreciated that those skilled in the art, upon consideration of the present disclosure, may make modifications and/or improvements on this invention that fall within the scope and spirit of the invention as set forth in the following claims.

What is claimed is:

1. A photosensitive composition comprising a diazonium polycondensation product and a binder comprising the recurring units of

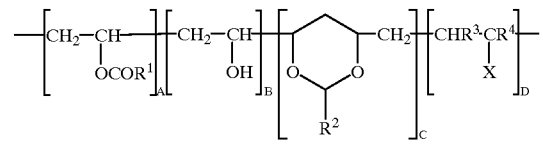

wherein A is present in 0.1 to 25 wt. %; B is present in 10 to 50 wt. %; C is present in 10 to 80 wt. %; D is present in 1 to 40 wt. %; X represents either the group —NHCO—R$^5$ or —CO—NHR$^6$; R$^1$ is a hydrogen atom or a C$_1$–C$_4$ aliphatic hydrocarbon or aromatic residue; R$^2$ is a hydrogen atom, alkyl, aralkyl, or aryl residue; R$^3$ and R$^4$ are independently selected from a hydrogen atom, C$_1$–C$_{10}$ alkyl residues; R$^5$ is selected from a hydrogen atom, C$_1$–C$_{10}$ aliphatic saturated or unsaturated hydrocarbon residue, optionally substituted by a carboxyl group, or an aromatic hydrocarbon residue, which can be substituted by a carboxyl group and other substituents; and R$^6$ is a C$_1$–C$_6$ hydrocarbon residue, optionally substituted by one or more hydroxyl, C$_1$–C$_3$ ether or amino, mono C$_1$–C$_3$ alkylamino, di- C$_1$–C$_3$ alkylamino or carboxyl groups, or an aromatic hydrocarbon residue containing at least one carboxyl or sulfonic acid group, or other substituent.

2. A photosensitive composition comprising a radical polymerizable system consisting of a photoinitiator, an unsaturated compound and a binder comprising the recurring units of

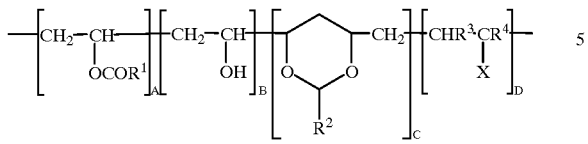

wherein A is present in 0.1 to 25 wt. %; B is present in 10 to 50 wt. %; C is present in 10 to 80 wt. %; D is present in 1 to 40 wt. %; X represents either the group —NHCO—$R^5$ or —CO—NH$R^6$; $R^1$ is a hydrogen atom or a $C_1$–$C_4$ aliphatic hydrocarbon or aromatic residue; $R^2$ is a hydrogen atom, alkyl, aralkyl, or aryl residue; $R^3$ and $R^4$ are independently selected from a hydrogen atom, $C_1$–$C_{10}$ alkyl residues; $R^5$ is selected from a hydrogen atom, $C_1$–$C_{10}$ aliphatic saturated or unsaturated hydrocarbon residue, optionally substituted by a carboxyl group, or an aromatic hydrocarbon residue, which can be substituted by a carboxyl group and other substituents; and $R^6$ is a $C_1$–$C_6$ hydrocarbon residue, optionally substituted by one or more hydroxyl, $C_1$–$C_3$ ether or amino, mono $C_1$–$C_3$ alkylamino, di- $C_1$–$C_3$ alkylamino or carboxyl groups, or an aromatic hydrocarbon residue containing at least one carboxyl or sulfonic acid group, or other substituent.

3. A photosensitive composition comprising a hybrid system consisting of a diazonium polycondensation product and a radical polymerizable system consisting of photoinitiators and unsaturated compounds and a binder comprising the recurring units of

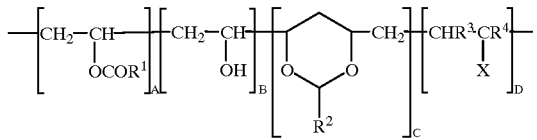

wherein A is present in 0.1 to 25 wt. %; B is present in 10 to 50 wt. %; C is present in 10 to 80 wt. %; D is present in 1 to 40 wt. %; X represents either the group —NHCO—$R^5$ or —CO—NH$R^6$; $R^1$ is a hydrogen atom or a $C_1$–$C_4$ aliphatic hydrocarbon or aromatic residue; $R^2$ is a hydrogen atom, alkyl, aralkyl, or aryl residue; $R^3$ and $R^4$ are independently selected from a hydrogen atom, $C_1$–$C_{10}$ alkyl residues; $R^5$ is selected from a hydrogen atom, $C_1$–$C_{10}$ aliphatic saturated or unsaturated hydrocarbon residue, optionally substituted by a carboxyl group, or an aromatic hydrocarbon residue, which can be substituted by a carboxyl group and other substituents; and $R^6$ is a $C_1$–$C_6$ hydrocarbon residue, optionally substituted by one or more hydroxyl, $C_1$–$C_3$ ether or amino, mono $C_1$–$C_3$ alkylamino, di- $C_1$–$C_3$ alkylamino or carboxyl groups, or an aromatic hydrocarbon residue containing at least one carboxyl or sulfonic acid group, or other substituent.

4. The composition of claim 1 wherein the diazonium polycondensation product of 3-methoxydiphenyl-amine-4-diazonium sulfate and 4,4'-bis-methoxymethyldiphenyl ether, which has been precipitated from an aqueous solution as organic sulfonate, tetrafluoroborate, hexafluorophosphate, hexafluoroantimonate or hexafluoroarsenate.

5. The composition of claim 1 wherein the photosensitive component is a radical polymerizable system containing a photoinitiator, sensitive to wavelengths in the region of 300 to 800 nm.

6. The composition of claim 1 further comprising an exposure indicator, a dye and an acid stabilizer.

7. A presensitized printing plate comprising the photosensitive composition of claim 1.

8. A presensitized printing plate comprising the photosensitive composition of claim 1.

9. A presensitized printing plate comprising the photosensitive composition of claim 2.

10. The composition of claim 1 in which X is —NH—CO$R^5$.

11. The composition of claim 10 in which $R^5$ is hydrogen, methyl, or phenyl.

12. The composition of claim 1 in which $R^1$ is methyl or phenyl.

13. The composition of claim 12 in which X is —NH—CO$R^5$ and $R^5$ is hydrogen, methyl, or phenyl.

14. The composition of claim 12 in which $R^2$ is a branched or unbranched alkyl residue of 1 to 10 carbon atoms or phenyl.

15. The composition of claim 1 in which $R^2$ is a branched or unbranched alkyl residue of 1 to 10 carbon atoms or phenyl.

16. The composition of claim 14 in which $R^3$ and $R^4$ are hydrogen.

17. The composition of claim 1 in which $R^3$ and $R^4$ are hydrogen.

18. The composition of claim 14 in which the $M_w$ of the binder is 20,000 to 130,00 g/mol.

19. The composition of claim 1 in which X is —NH—CO$R^5$.

20. The composition of claim 19 in which $R^1$ is methyl or phenyl.

* * * * *